United States Patent
Chavhan et al.

(10) Patent No.: US 10,210,301 B2
(45) Date of Patent: Feb. 19, 2019

(54) SYSTEM AND METHOD FOR IMPLEMENTING AND VALIDATING STAR ROUTING FOR POWER CONNECTIONS AT CHIP LEVEL

(71) Applicant: Cadence Design Systems, Inc., San Jose, CA (US)

(72) Inventors: Ankur Chavhan, Jabalpur (IN); Devesh Jain, Haryana (IN); Behnam Farhat, San Jose, CA (US); Andrey Freidlin, Zhyukovskiy (RU); Sundararajan Shanmugam, San Jose, CA (US); Susan Zueqing Zhang, Los Altos, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 173 days.

(21) Appl. No.: 14/806,462

(22) Filed: Jul. 22, 2015

(65) Prior Publication Data
US 2016/0210393 A1   Jul. 21, 2016

Related U.S. Application Data

(63) Continuation of application No. PCT/RU2015/000033, filed on Jan. 21, 2015.

(51) Int. Cl.
*G06F 17/50* (2006.01)

(52) U.S. Cl.
CPC ...... *G06F 17/5077* (2013.01); *G06F 17/5009* (2013.01); *G06F 17/5081* (2013.01)

(58) Field of Classification Search
CPC ............ G06F 17/5009; G06F 17/5077; G06F 17/5081
See application file for complete search history.

(56) References Cited

U.S. PATENT DOCUMENTS 7,506,277 B1 * 3/2009 Arora .................. G06F 17/5081
716/122
7,620,922 B1 * 11/2009 Wadland ............. G06F 17/5077
716/119

(Continued)

OTHER PUBLICATIONS

Erhard, Karl-Heinz et al., "Power/Ground Networks in VLSI: Are General Graphs Better than Trees?" Integration, The VLSI Journal, North-Holland Publishing Company, Amsterdam, NL, vol. 14, No. 1, Nov. 1992, pp. 91-109.

(Continued)

*Primary Examiner* — Vuthe Siek
(74) *Attorney, Agent, or Firm* — Hunton Andrews Kurth LLP

(57) ABSTRACT

A system, method, and computer program product for automating the design and routing of non-shared one-to-many conductive pathways between a common pad and circuit blocks in an integrated circuit. Such pathways are routinely required for power and signal distribution purposes. Automated scripts perform a star routing methodology and validate the routing results. The methodology processes input width and layer constraints and from-to's denoting start and end points for each route by invoking a star_route command in a router that implements interconnections as specified. Routing results are validated by checking for routing violations, including shared segments and width violations. Violations are marked for correction.

20 Claims, 7 Drawing Sheets

(56) References Cited

U.S. PATENT DOCUMENTS

| | | | |
|---|---|---|---|
| 8,099,700 B1 | 1/2012 | Waller et al. | |
| 2005/0289494 A1* | 12/2005 | Kozhaya | G06F 17/5077 716/112 |
| 2006/0101368 A1* | 5/2006 | Kesarwani | G06F 17/5045 716/137 |
| 2008/0092099 A1* | 4/2008 | Lin | G06F 17/5077 716/122 |
| 2010/0115487 A1* | 5/2010 | Tripathi | G06F 17/5081 716/122 |
| 2012/0144355 A1* | 6/2012 | Dai | G06F 17/5081 716/112 |
| 2013/0219353 A1* | 8/2013 | Henrickson | G06F 17/5077 716/122 |
| 2016/0070394 A1* | 3/2016 | Van Ostrand | G06F 3/047 345/173 |

OTHER PUBLICATIONS

Chowdhury, S. et al., "Optimum Design of IC Power/Ground Nets Subject to Reliability Constraints," IEEE Transactions on Computer Aided Design, IEEE Service Center, Piscataway, NJ, vol. 7, No. 7, Jul. 1988, pp. 787-796.

Villal, Ashok et al., "Power Distribution Topology Design," 32nd ACM/IEEE Design Automation Conference, Jan. 1, 1995, pp. 503-507.

International Search Report dated Dec. 3, 2015, in International Application No. PCT/RU2015/000033 (4 pages).

International Preliminary Report on Patentability dated Jul. 25, 2017, in International Application No. PCT/RU2015/000033 (8 pages).

* cited by examiner

SYSTEM AND METHOD FOR IMPLEMENTING AND VALIDATING STAR ROUTING FOR POWER CONNECTIONS AT CHIP LEVEL

CROSS-REFERENCE TO RELATED APPLICATIONS

This application claims the priority benefit of commonly-assigned identically-entitled patent application PCT/RU2015/000033 filed on Jan. 21, 2015, which is hereby incorporated by reference in its entirety.

FIELD OF THE INVENTION

This description relates to the field of circuit simulation, and more precisely to the automated design and routing of non-shared one-to-many conductive pathways between a common pad and circuit blocks in an integrated circuit.

BACKGROUND

During the process of designing of integrated circuits, there may be instances where the same power supply pad may need to provide a supply voltage to many different circuit blocks through conductive pathways or interconnections. Each circuit block may have particular current and/or resistance specifications. That is, each circuit block may require a particular amount of current, or be able to tolerate only a particular amount of voltage drop from the power supply pad, or both so that a maximum interconnection resistance may be determined.

In a typical integrated circuit fabrication process, various different metal layers may be available for use by the designer to form such conductive pathways. The thickness and resistivity of these metal layers may be fixed for a given process, but the designer may still control the length and width of each of the pathways. The pathways may comprise multiple interconnected portions. Connections from one metal layer to another may be formed through vias or other structures, as may be known in the art.

A great deal of manual design work may be needed to define the individual geometric routes for the conductive interconnections needed between power supply pads and circuit blocks. Each of these routes is non-shared, e.g., electrically non-overlapping, with any other route on the same network in a design, to meet strict voltage and resistance requirements. This type of routing is generally known as star routing. In so-called Manhattan-type routing, each route comprises metal runs that connect only directly or at right angles. Each conductive pathway may have a different fabrication layer and width control requirement.

There are many difficulties with the conventional routing methodology presently used by integrated circuit designers. First, the present methodology is manual, and manual routing is a very tedious and labor intensive job. The designer must manually determine the routes from each power supply pad to each connected circuit block while considering all relevant design constraints. Since no sharing of any conductive path portions is allowed between the different routes in star routing, the designer must take extra care while allocating the routing resources.

Further, for each change in a design floorplan, e.g., placement of power supply pads and circuit blocks, the routing may need to be repeated, with no gain in designer productivity. Additionally, changes to circuit block power requirements may also require changes to the width and/or length of each of the various conductive pathways. Modification of circuit block power requirements is a common occurrence during design iterations, and may also dictate a complete reworking of an initial routing.

There is also presently no automatic validation option available to verify the routing results. Logically, the various conductive paths are all the same, therefore traditional connectivity extraction tools used for layout versus schematic verification and electrical rule checking will not flag the paths as having any violations. That is, forbidden electrical overlaps that may occur may not necessarily cause noticeable topology problems, but they may still adversely impact circuit operation due to the stringent voltage and resistance requirements.

Finally, conventional automated routing tools currently available from commercial electronic design tool vendors route the entire integrated circuit as a whole. Thus, there may be no provision in any of them to separately create multiple non-shared interconnections on the same network, e.g., route a selected subset of an integrated circuit. This limitation may interfere with design re-use, further constraining circuit designer productivity.

Thus, there is a need for an improved approach to automating the design and routing of non-shared one-to-many conductive pathways between a common pad and circuit blocks in an integrated circuit. Accordingly, the inventors have developed a novel way to help circuit designers and design tool vendors address this issue.

DETAILED DESCRIPTION

This description presents a system, method, and computer program product for automating the design and routing of non-shared one-to-many conductive pathways between a common pad and circuit blocks in an integrated circuit.

Figure 1:
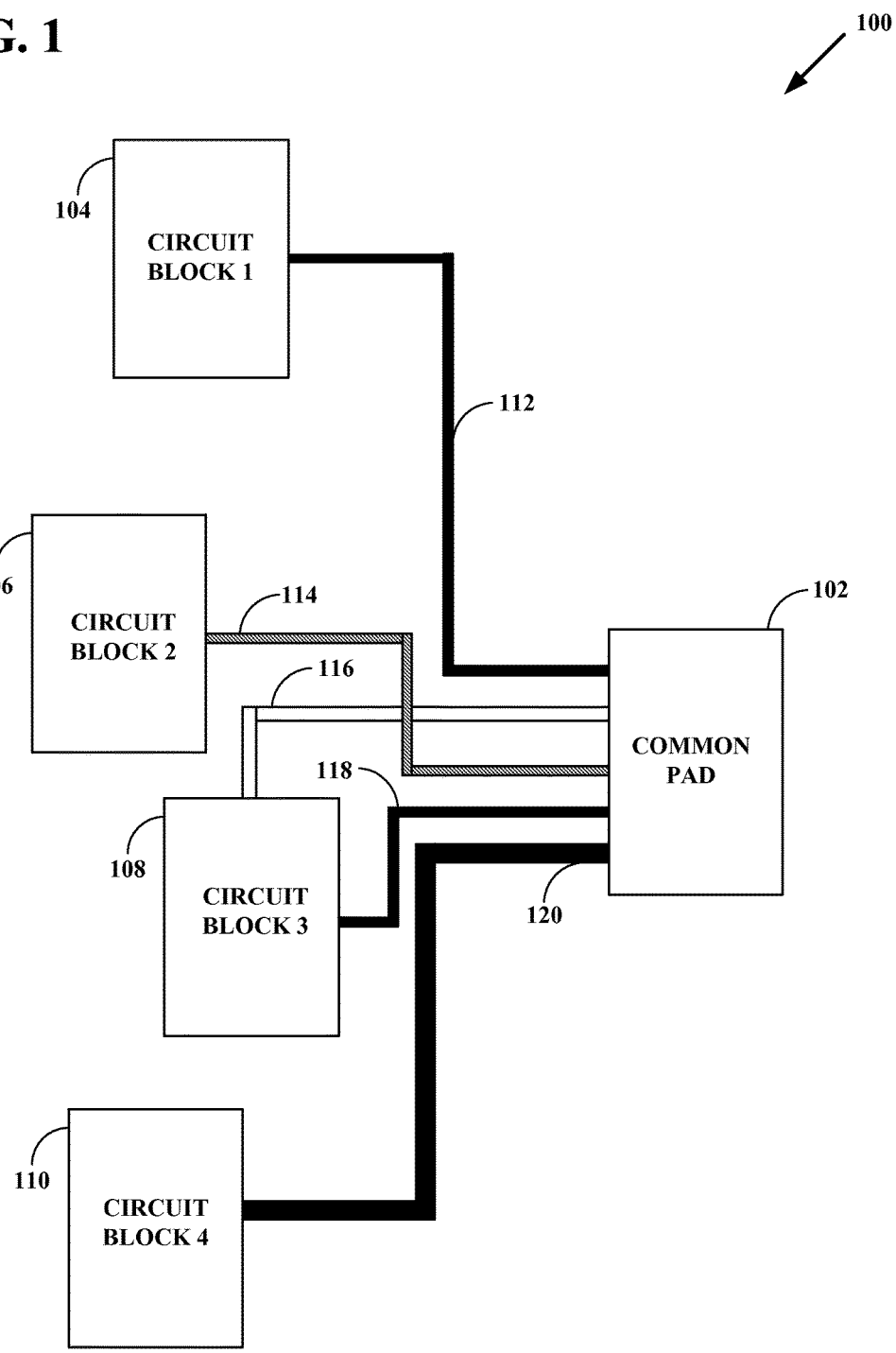
FIG. 1 is a diagram of an integrated circuit 100, according to an embodiment.

FIG. 1 shows a diagram of an integrated circuit 100, according to an embodiment. This figure shows the high level requirements for star routing, and the methods of depicting many concepts used in this description. A single common supply pad 102 is available to supply power to multiple circuit blocks 104-110 with typically different resistance requirements. Power distribution is perhaps the most common scenario for star routing, and for brevity is the exemplary use described herein, but the invention is not limited to that application. Clock signals may also be distributed from a common point to a multitude of circuit blocks for example via star routing. Similarly, data signals may fan out from a single origination point to multiple separate destinations through multiple star-routed pathways, as would be readily understood by one of ordinary skill in the art of circuit design.

FIG. 1 depicts metal runs 112-120 as ribbons of given dimensions denoting their individually fabricated widths. For example, metal run 120 is wider than the others, perhaps to provide more current within a limited voltage drop constraint and/or to enable use of a lower resistance conductor. Different colors for the ribbons (e.g., white, gray, and black) depict different metal layers in FIG. 1. Although this figure shows each conductive pathway as comprising a single metal layer for clarity, that is very often not the case in actual integrated circuit routing.

Further, note that more than one interconnection may exist between the common pad 102 and circuit blocks 104-110, as shown for example with circuit block 108 which has two separately routed conductive pathways 116 and 118. Each such pathway may lead to a particular specified point in a circuit block, typically called a pin. In some instances, particularly where large currents are to be provided to a circuit block, multiple pathways may actually be connected from the common pad to a number of different pins in a given circuit block.

Each conductive pathway may generally be designed to be non-shared, so there is no direct electrical connection between any point in one routed pathway and another. For example, pathways 114 and 116 appear to intersect in the planar view shown in FIG. 1, but these pathways may actually use different metal levels in the integrated circuit 100. Each fabricated metal level may be physically vertically separated from another by an intervening electrically insulating layer, as is known in the art.

The use of non-shared pathways may seem inefficient, but it allows the designer to more separately manage the various design constraints in a design situation where many different aspects of a design may be in rapid flux. Apart from the floorplanning and power changes previously mentioned, designers are also faced with other problems that may arise due to changes in a design, such as power analysis, timing performance, and signal integrity issues. If the routing process is kept more separable and made more automated, the designer may be free to focus on other design considerations.

The inventors therefore now provide a holistic solution to the star routing problem to better meet the requirements of the integrated circuit design community. The embodiments of the invention may replace the conventional manual routing process with an entirely automated scripted star routing methodology. There are two basic aspects to the new routing methodology: the implementation of star routing, and the validation of the routing results.

In one embodiment, the routing aspect uses the "star_route" command in a commercially available router application to create non-shared routes between a supply pad and the various circuit blocks that connect to the supply pad. An embodiment may also provide an automated solution to validate the routing results by using a commercially available physical verification application to verify the routing quality. The physical verification system's debugging environment may enable the user to zoom to layout markers created to denote problem points, and to fix them easily.

Huge productivity gains may result from the reduction in runtime, e.g., from weeks to days or hours, for the overall power distribution implementation cycle for each design iteration of a large integrated circuit. The star routing process of the embodiments is fully automated. Validation of the star routing may also be completed in approximately the same time required for the routing itself.

Implementation of Star Routing

The first step in the implementation of star routing in one embodiment is creating the width and layer constraints for each route portion. Since each conductive pathway from the common pad to a circuit block may have different resistance and/or current requirements, appropriate conductor layer and width controls may be needed for each such interconnection. The width and layer control for individual route portions between the supply pad and the circuit blocks may be defined as individual technology constraint groups. The different requirements for each connection may be created in a separate constraint group.

Example

To create width constraints for routing layers in a user defined constraint group named cg1:

```
create_constraint_group -name cg1
set_layer_constraint -layer Metal2 -group cg1 -constraint minWidth -Value 0.6
set_layer_constraint -layer Metal3 -group cg1 -constraint minWidth -Value 0.6
set_layer_constraint -layer Metal4 -group cg1 -constraint minWidth -Value 0.6
set_layer_constraint -layer Metal5 -group cg1 -constraint minWidth -Value 0.6
```

This constraint group may set a minimum width value of 0.6 for metal layers Metal2 through Metal5. The following command may control the routing layers for the constraint group cg1:

```
set_constraint -constraint validRoutingLayers -LayerArrayValue {Metal5 Metal4 Metal3 Metal2} -hardness hard -group cg1
```

The command above may restrict routing to only metal layers Metal2 through Metal5, and according to the minimum width value constraints previously defined. Any interconnection created with these constraints specified that fails to obey any one of them will result in a routing failure, to be detected and corrected as will be described.

The second step in the implementation of star routing in one embodiment is creating a "from-to" to indicate the start point and end point for each pad to circuit block interconnection. The from-to is a new entity that may serve as a guide for specifying connection objectives for each conductive pathway. Embodiments may assign the constraint group required to route each interconnection with this from-to.

Example

To create from-to's for multiple connections from a single pad named I0 to multiple circuit block instances in a design with different constraint groups cg1 through cg3:

```
create_fromto -fromSet [find_inst_term -instance_name I0 -name top_in_4] -fromLayer Metal2 -toSet [find_inst_term -instance_name I4 -name in_1] -constraintGroup cg1
create_fromto -fromSet [find_inst_term -instance_name I0 -name top_in_4] -fromLayer Metal2 -toSet [find_inst_term -instance_name I5 -name in_2] -constraintGroup cg2
create_fromto -fromSet [find_inst_term -instance_name I0 -name
```

```
top_in_4] -fromLayer Metal2 -toSet [find_inst_term -instance_name
|I5 -name in_3] -constraintGroup cg3
```

Sometimes the same circuit block terminal may have multiple pin shapes which all also need to be connected in a non-shared manner. This is the situation depicted in FIG. 1 for circuit block 108 for example. This feature may be supported in one embodiment by a separate construct "-must_connect" in the create_fromto command.

Example

To create a from-to from a pad to a circuit block terminal which has multiple pin shapes, all of which need to be connected.

```
create_fromto -fromSet [find_inst_term
    -instance_name I0 -name top_in_4]
    -fromLayer Metal2 -toSet [find_inst_term
    -instance_name |I3 -name in _1]
    -constraintGroup cg1 -must_connect
```

Figure 2:
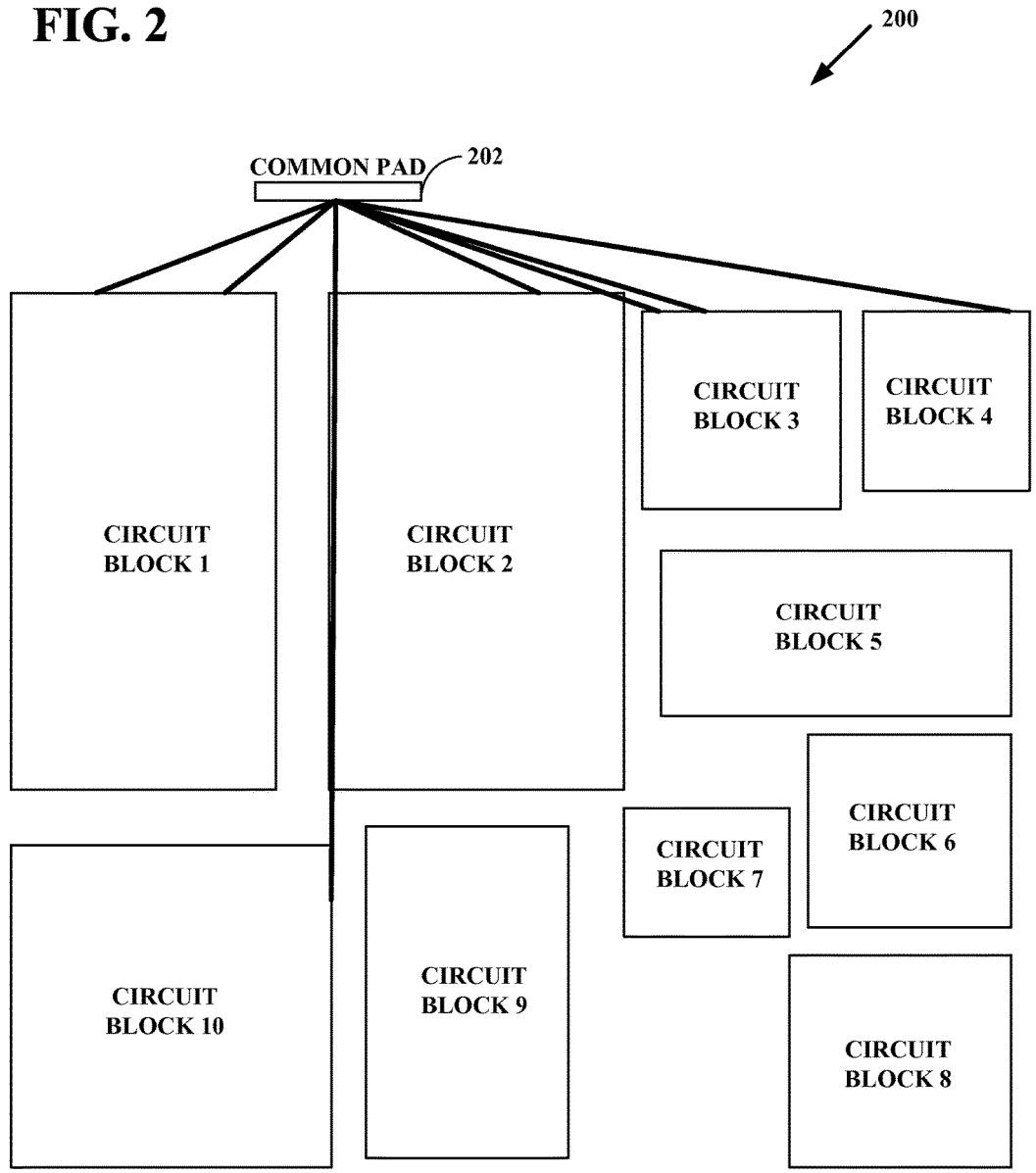
FIG. 2 is a diagram of an integrated circuit 200 with from-to's, according to an embodiment.

FIG. 2 shows a diagram of an integrated circuit 200 with from-to's, according to an embodiment. For clarity, the circuit blocks are referred to by their internal numbers, and individual from-to's are not provided with part numbers in this symbolic depiction. Circuit blocks 1-4 and 10 each have pins that need to be connected to the common pad 202 at the top of FIG. 2. Circuit blocks 2, 4, and 10 each require only one conductive pathway, while circuit blocks 1 and 3 require two separate conductive pathways. Each from-to thus proceeds from the common pad, which may supply a positive supply voltage for example, to a particular pin on a particular circuit block. Each from-to is depicted in FIG. 2 as a simple straight line between the start point and the end point of each interconnection to be routed. This depiction may be helpful for a circuit designer specifying a number of desired interconnections prior to routing.

The third step in the implementation of star routing in one embodiment is invoking the star_route command to connect each specified from-to individually, without sharing any routing portions although all the from-to's are on the same design network. Embodiments include a new methodology to handle this specific request for non-shared portions on the same design network.

Example

Figure 3:
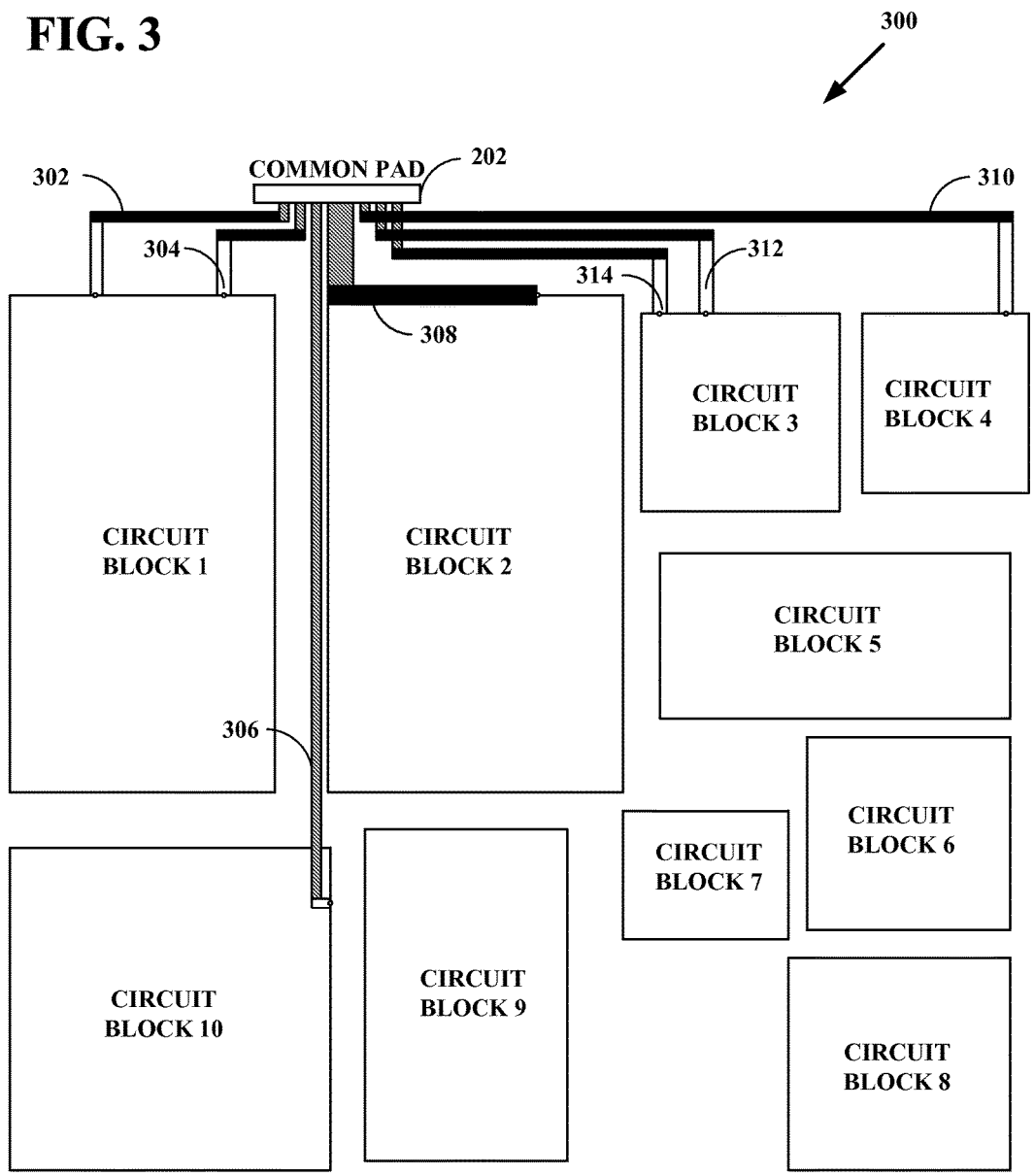
FIG. 3 is a diagram of a routed integrated circuit 300, according to an embodiment.

To route the network top_in_1 in the design:
star_route-set [find_net-name top_in_1]-route_only FIG. 3 shows a diagram of a routed integrated circuit 300, according to an embodiment. Each symbolic from-to of FIG. 2 has been replaced by an exemplary routed interconnection from common pad 202 to the specified pin of each specified circuit block. In this depiction, the specified pins are shown as small dots signifying the end point of each routed pathway. Each routed pathway 302-314 is shown here as using two or three different metal layers (e.g., white, gray, or black) merely to emphasize this possibility, though it is not required as one of ordinary skill in the art of circuit design would readily understand. While each routed pathway 302-314 connects to the common pad 202, each may do so at a different physical point, so that no routed pathway includes any shared connection per se. Note that routed path 308 is wider than the others in this example, as a result of resistance and/or current constraints related to its connected circuit block. Also note that circuit blocks 1 and 3 each have two conductive pathways connected to the common pad 202, as specified by the from-to's depicted in FIG. 2.

Validation Using a Physical Verification Tool

In one embodiment, a physical verification tool runset may check for the following types of violations created by the routing implementation:

Shared Segments—This check may validate that each from-to has been routed separately and that there is no sharing of any routing shape between multiple from-to's, even if they are on the same design network. The embodiment may trace each from-to created by the routing tool and identify the bifurcation point based on the number of ninety degree corners in the routing portion. If the number of segments abutting corners in a given routing portion is greater than two, then the embodiment may flag the violation for correction. For embodiments that allow non-Manhattan routing, which are within the scope of the invention, other rules for detecting shared segments may be applied.

Width Violations—This check may validate that the width for each of the routed shapes meets the width specified in the constraint group for each corresponding from-to. The rule deck may flag violations for all shapes below a specific width value for correction.

The embodiment may create markers to highlight the locations of these violations, and any other violations that may be checked, for the user. The user may then take corrective action as needed.

Figure 4:
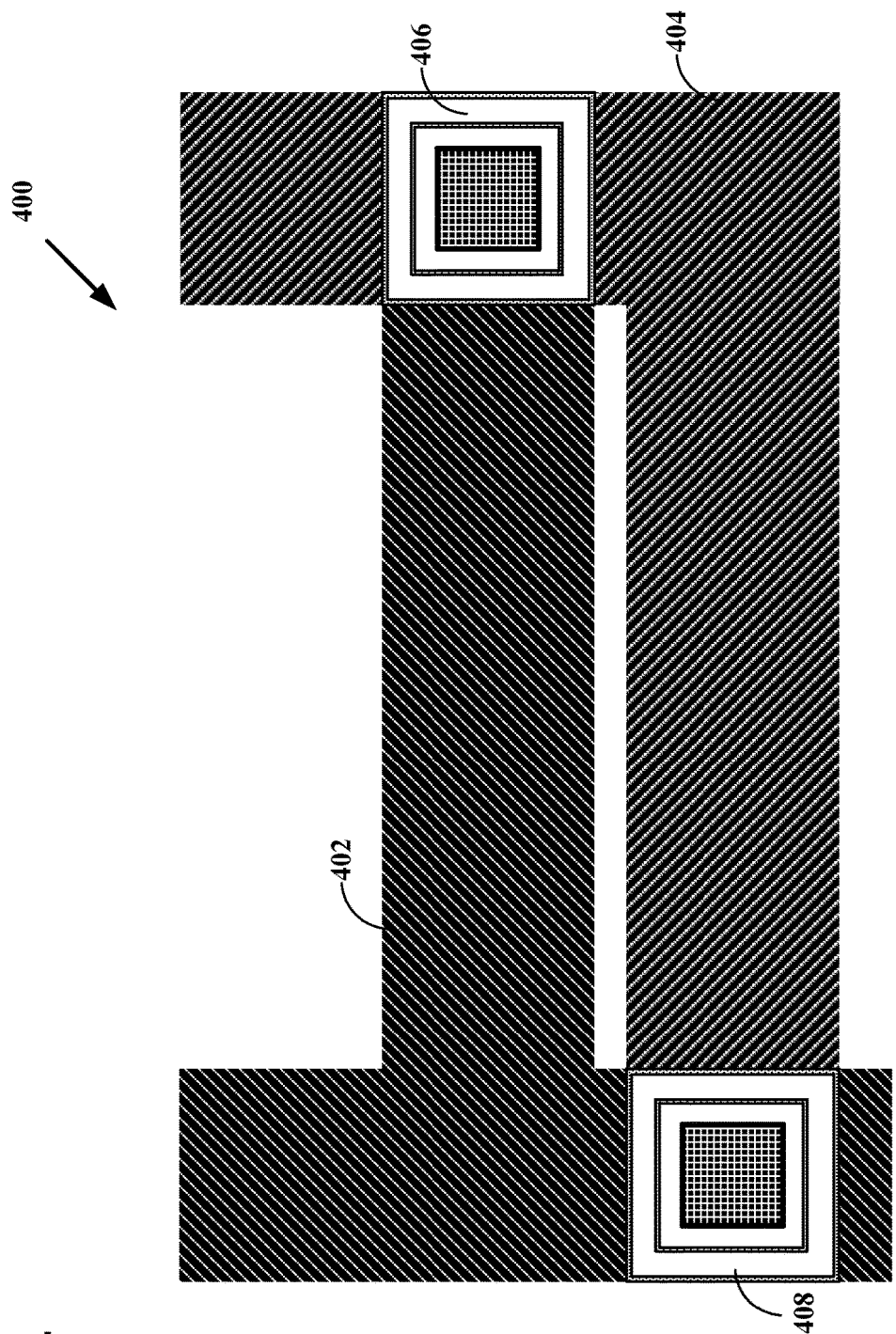
FIG. 4 is a diagram of an integrated circuit portion 400 including marked routing violations, according to an embodiment.

FIG. 4 shows a diagram of an integrated circuit portion 400 including marked routing violations, according to an embodiment. In this example, there are two routed paths 402 and 404 (shown by alternate diagonal shadings). The routing process has however somehow led to two shared segments, each of which is a violation. An embodiment may therefore mark the shared segments by markers 406 and 408 to assist the designer in finding and correcting the violations.

Figure 5:
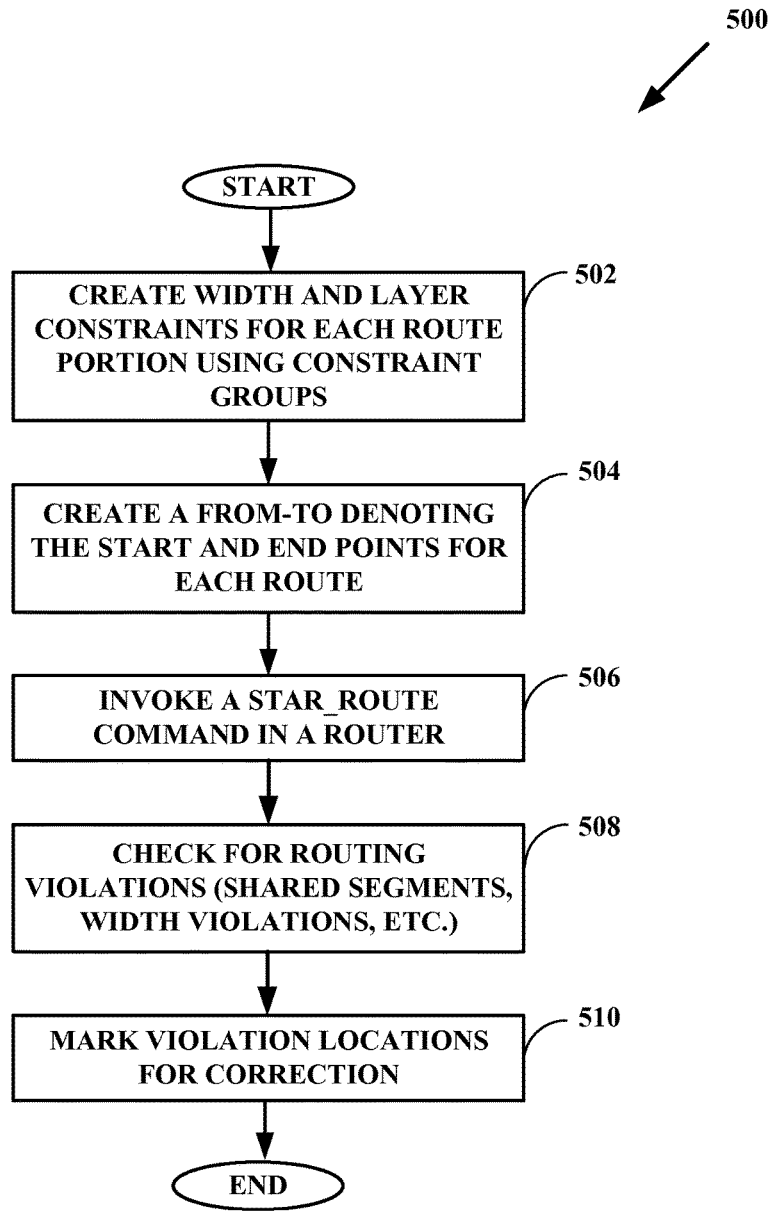
FIG. 5 is a flowchart of a process 500 for automated star routing, according to an embodiment.

FIG. 5 shows a flowchart of a process 500 for automated star routing, according to an embodiment. At 502, a user may create width and layer constraints for each route portion, using constraint groups for example. At 504, the user may create a from-to denoting the start and end points for each route. At 506, the user may invoke a star_route command in a router, which may perform the routing according to the constraints and from-to's specified. At 508, embodiments may check for routing violations, such as shared segments and width violations. At 510, embodiments may mark violation locations for correction.

To summarize, the automated star routing embodiments may replace previous manual methods and provide far greater speed. Automated quality checks may be provided through physical verification tools, replacing the conventional manual visual inspection process. Further, embodiments may handle successive iterations due to changes in floorplan or circuit block requirements much more efficiently. Huge productivity gains may result from the reusable, script-based automated embodiments. Finally, the routing violations highlighted by the physical verification tool runset may be easily found and repaired by the designer.

Figure 6:
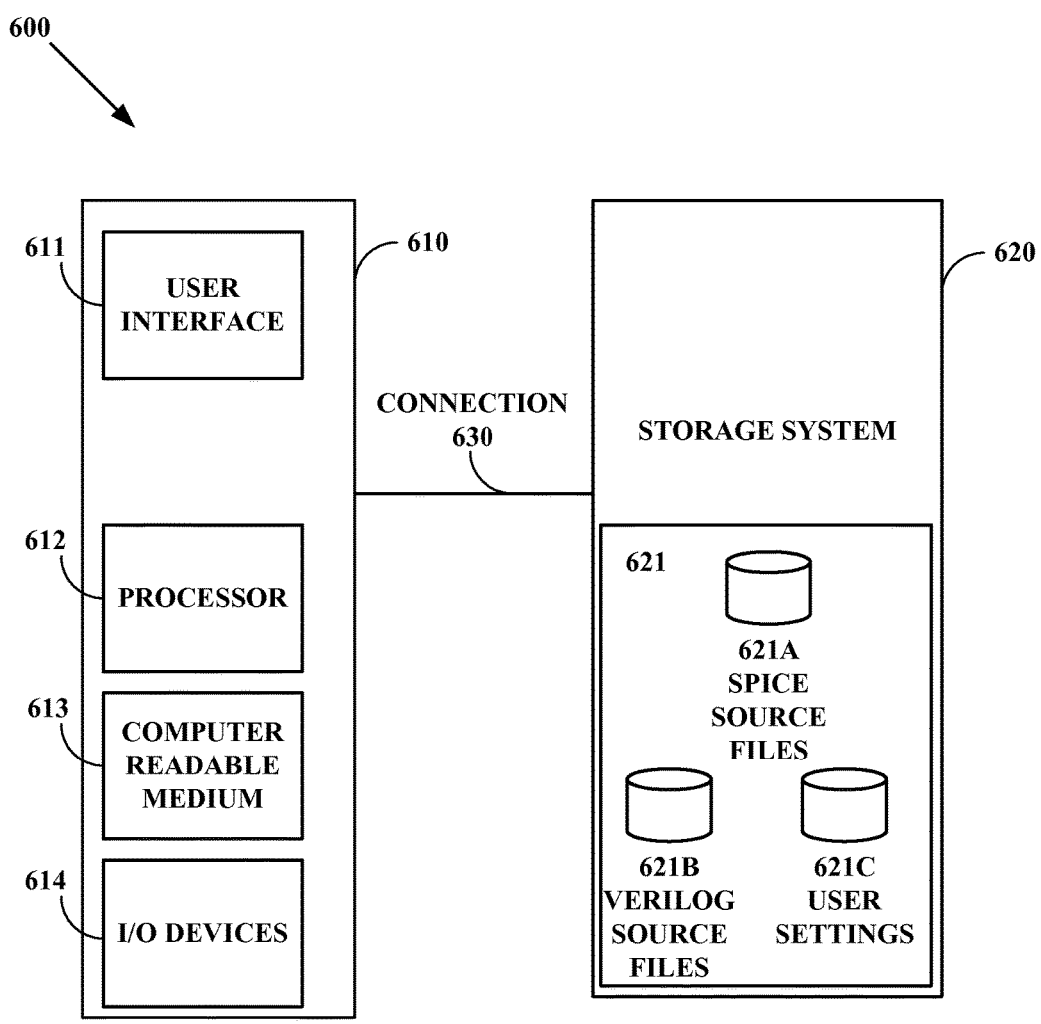
FIG. 6 is a block diagram of a circuit analysis system 600, according to an embodiment.

FIG. 6 shows a block diagram of an exemplary circuit analysis system 600, according to an embodiment. This system may provide simulator functionality for any of the methods described above. A user may access the system 600 through a standalone client system, client-server environment, or a network environment. System 600 may comprise one or more clients or servers 610, one or more storage systems 620, and a connection or connections 630 between and among these elements.

Client 610 may execute instructions stored on transitory or non-transitory computer readable medium 613 with processor 612, and may provide a user interface 611 to allow a user to access storage system 620. The instructions may be part of a software program or executable file that may operate electronic design automation (EDA) software. Client 610 may be any computing system, such as a personal computer, workstation, mobile computer, or other device employing a processor which is able to execute programming instructions. User interface 611 may be a GUI run in a user-controlled application window on a display. A user may interact with user interface 611 through one or more input/output (I/O) devices 614 such as a keyboard, a mouse, or a touch screen.

Storage system 620 may take any number of forms, including but not limited to a server with one or more storage devices attached to it, a storage area network, or one or a plurality of non-transitory computer readable media. Databases 621 may be stored in storage system 620 such that they may be persistent, retrieved, or edited by the user. Databases 621 may include SPICE source files 621A, Verilog source files 621B, and a user input database 621C for example. These databases may be kept as separate files or systems, or may be merged together in any appropriate combination.

Only one client 610 is shown connected to storage system 620 through connection 630, which may be a simple direct wired or wireless connection, a system bus, a network connection, or the like, to provide client 610 with access to storage system 620. In another aspect, connection 630 may enable multiple clients 610 to connect to storage system 620. The connection may be part of a local area network, a wide area network, or another type of network, again providing one or more clients with access to storage system 620. Depending on system administrator settings, client 610's access to system storage 620 or to other clients may be limited.

Figure 7:
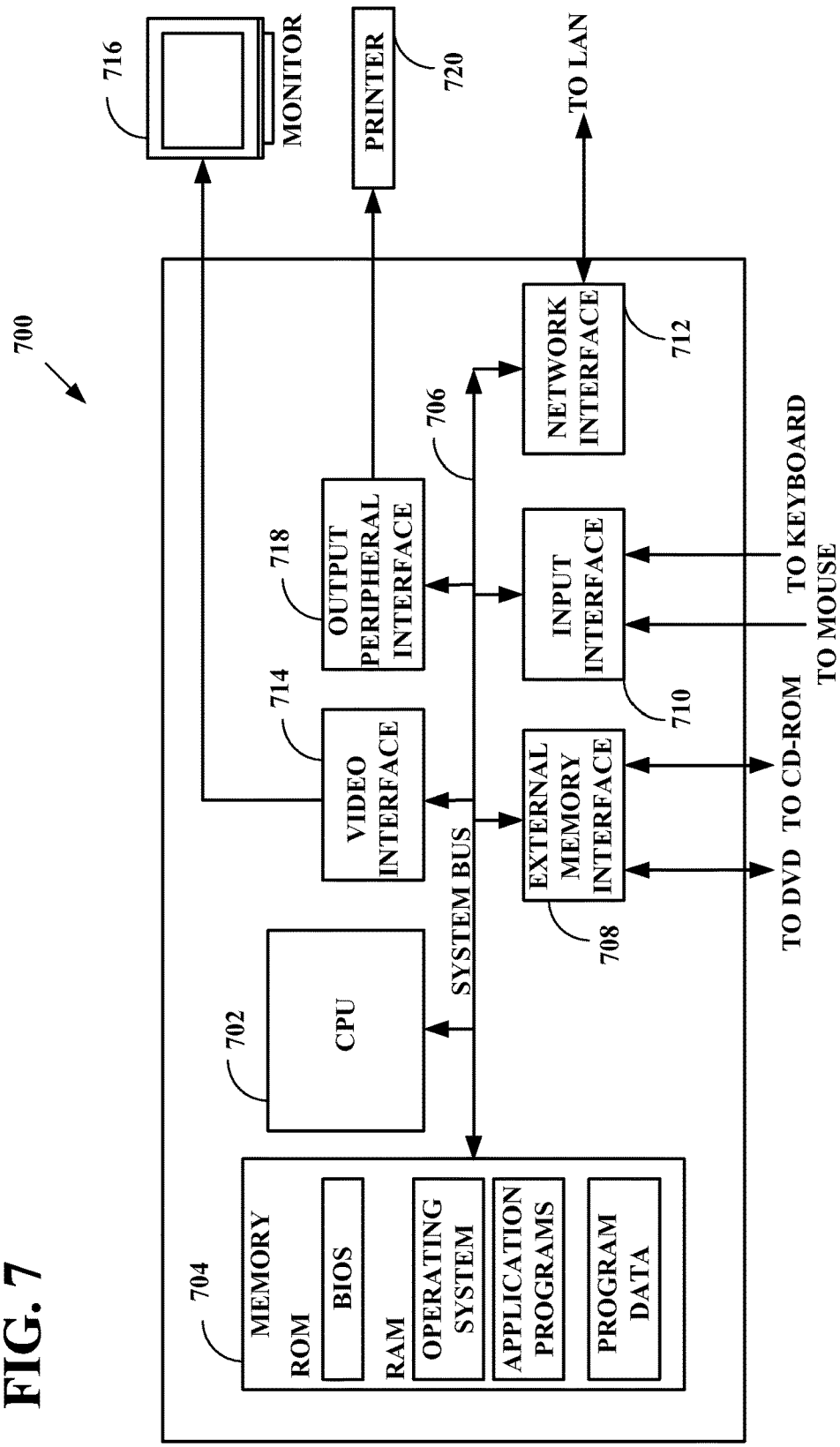
FIG. 7 is a diagram of a computer system 700, according to an embodiment.

FIG. 7 depicts an exemplary computer system comprising the structure for implementation of the embodiments described above. Computer system 700 comprises a central processing unit (CPU) 702 that processes data stored in memory 704 exchanged via system bus 706. Memory 704 typically includes read-only memory, such as a built-in operating system, and random-access memory, which may include an operating system, application programs, and program data. Computer system 700 also comprises an external memory interface 708 to exchange data with a DVD or CD-ROM for example. Further, input interface 710 may serve to receive input from user input devices including but not limited to a keyboard and a mouse. Network interface 712 may allow external data exchange with a local area network (LAN) or other network, including the internet. Computer system 700 also typically comprises a video interface 714 for displaying information to a user via a monitor 716. An output peripheral interface 718 may output computational results and other information to output devices including but not limited to a printer 720.

Computer system 700 may comprise for example a personal computer or an engineering workstation, each of which is widely known in the art and is commonly used for integrated circuit design tasks, along with software products commercially available for performing computer-aided integrated circuit design tasks. Computer system 700 may also comprise a mobile computer, including for example a tablet computer or a smart phone. The computer system of FIG. 7 may for example receive program instructions, whether from existing software products or from embodiments of the present invention, via a computer program product and/or a network link to an external site.

For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments may serve as the code segments directing a computing device to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention are possible. The invention is limited only by the scope of the appended claims.

What is claimed is:

1. A processor-implemented method for automatically creating multiple non-shared one-to-many routed conductive pathways between a common pad and at least one circuit block in a circuit design, the method comprising:
    using a processor:
        for each intended non-shared conductive pathway between the common pad and the at least one circuit block:
            creating constraints for widths and conductive layers allowed for each pathway portion; and
            specifying a from-to denoting a start point and an end point between the common pad and the at least one circuit block;
        invoking a computer-operated star router tool to route the intended conductive pathways according to the constraints and the from-tos, wherein one or more of the constraints for at least one intended conductive pathway are different from one or more of the constraints for at least one other intended conductive pathway;
        validating that at least one routed conductive pathway between the common pad and the at least one circuit block does not share a conductive pathway segment with at least one other routed conductive pathway, wherein the validating includes tracing each of the routed conductive pathways; and
        fabricating an integrated circuit based at least in part on the validating.

2. The method of claim 1 wherein the constraints are defined by at least one technology constraint group.

3. The method of claim 1 wherein the from-to assigns connections for multiple pins.

4. The method of claim 1 wherein the conductive pathways provide at least one of a power supply connection, a ground connection, a clock signal connection, and a data signal connection from the common pad to the at least one circuit block.

5. The method of claim 1 wherein the validating of the routed conductive pathways includes checking for at least one particular type of violation.

6. The method of claim 5 wherein the particular type of violation comprises at least one of a shared segment violation and a width violation.

7. The method of claim 5 further comprising creating markers to denote violation locations for correction.

8. A non-transitory computer readable medium storing instructions that, when executed by a processor, perform a method for automatically creating multiple non-shared one-to-many routed conductive pathways between a common pad and at least one circuit block in a circuit design, the processor-implemented method comprising:
    for each intended non-shared conductive pathway between the common pad and the at least one circuit block:
        creating constraints for widths and conductive layers allowed for each pathway portion; and
        specifying a from-to denoting a start point and an end point between the common pad and the at least one circuit block;
    invoking a computer-operated star router tool to route the intended conductive pathways according to the constraints and the from-tos, wherein one or more of the constraints for at least one intended conductive pathway are different from one or more of the constraints for at least one other intended conductive pathway;
    validating that at least one routed conductive pathway between the common pad and the at least one circuit block does not share a conductive pathway segment with at least one other routed conductive pathway, wherein the validating includes tracing each of the routed conductive pathways; and
    fabricating an integrated circuit based at least in part on the validating.

9. The medium of claim 8 wherein the constraints are defined by at least one technology constraint group.

10. The medium of claim 8 wherein the from-to assigns connections for multiple pins.

11. The medium of claim 8 wherein the conductive pathways provide at least one of a power supply connection, a ground connection, a clock signal connection, and a data signal connection from the common pad to the at least one circuit block.

12. The medium of claim 8 wherein the validating of the routed conductive pathways includes checking for at least one particular type of violation.

13. The medium of claim 12 wherein the particular type of violation comprises at least one of a shared segment violation and a width violation.

14. The medium of claim 12 further comprising creating markers to denote violation locations for correction.

15. A system for automatically creating multiple non-shared one-to-many routed conductive pathways between a common pad and at least one circuit block in a circuit design, comprising:
    a memory storing executable instructions; and
    a processor executing instructions to:
        for each intended non-shared conductive pathway between the common pad and the at least one circuit block:
            create constraints for widths and conductive layers allowed for each pathway portion; and
            specify a from-to denoting a start point and an end point between the common pad and the at least one circuit block;
        invoke a computer-operated star router tool to route the intended conductive pathways according to the constraints and the from-tos, wherein one or more of the constraints for at least one intended conductive pathway are different from one or more of the constraints for at least one other intended conductive pathway;
        validate that at least one routed conductive pathway between the common pad and the at least one circuit block does not share a conductive pathway segment with at least one other routed conductive pathway, wherein the validating includes tracing each of the routed conductive pathways; and
        fabricate an integrated circuit based at least in part on the validating.

16. The system of claim 15 wherein the constraints are defined by at least one technology constraint group.

17. The system of claim 15 wherein the from-to assigns connections for multiple pins.

18. The system of claim 15 wherein the conductive pathways provide at least one of a power supply connection, a ground connection, a clock signal connection, and a data signal connection from the common pad to the at least one circuit block.

19. The system of claim 15 wherein the validating of the routed conductive pathways includes checking for at least one of a shared segment violation and a width violation.

20. The system of claim 15 further comprising instructions to create markers to denote violation locations for correction.

* * * * *